(12) United States Patent
Do

(10) Patent No.: US 7,646,656 B2
(45) Date of Patent: Jan. 12, 2010

(54) SEMICONDUCTOR MEMORY DEVICE

(75) Inventor: Chang-Ho Do, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 16 days.

(21) Appl. No.: 12/003,684

(22) Filed: Dec. 31, 2007

(65) Prior Publication Data

US 2009/0010078 A1  Jan. 8, 2009

(30) Foreign Application Priority Data

Jul. 3, 2007  (KR) .................. 10-2007-0066482

(51) Int. Cl.
*G11C 7/00* (2006.01)
(52) U.S. Cl. ............. 365/201; 365/189.07; 365/189.09; 365/189.11
(58) Field of Classification Search ................. 365/201, 365/189.07, 189.09, 189.11
See application file for complete search history.

(56) References Cited

U.S. PATENT DOCUMENTS

| | | | |
|---|---|---|---|
| 5,263,031 A | 11/1993 | Inoue | |
| 5,424,984 A * | 6/1995 | Nagahama et al. ..... | 365/189.05 |
| 5,687,180 A | 11/1997 | Kawasaki | |
| 5,886,567 A | 3/1999 | Park et al. | |
| 5,901,105 A | 5/1999 | Ong et al. | |
| 6,104,233 A * | 8/2000 | Fujii et al. .................. | 327/534 |
| 6,154,074 A * | 11/2000 | Nakashima ................. | 327/163 |
| 6,169,426 B1 | 1/2001 | Lee et al. | |
| 6,545,510 B1 * | 4/2003 | Cowles .......................... | 327/74 |
| 6,636,110 B1 * | 10/2003 | Ooishi et al. ................. | 327/565 |
| 6,657,452 B2 * | 12/2003 | Beer et al. ................... | 324/765 |
| 6,798,225 B2 * | 9/2004 | Miller ......................... | 324/754 |
| 6,940,765 B2 | 9/2005 | Kyung | |
| 7,028,235 B1 * | 4/2006 | Kato .......................... | 714/716 |
| 7,168,017 B2 * | 1/2007 | Kim et al. ................... | 714/718 |

FOREIGN PATENT DOCUMENTS

| | | |
|---|---|---|
| JP | 09-106698 | 4/1997 |
| JP | 10-199244 | 7/1998 |
| JP | 2003-242798 | 8/2003 |
| JP | 2005-071582 | 3/2005 |
| KR | 1020030080348 A | 10/2003 |
| KR | 10-2007-0036639 | 4/2007 |

OTHER PUBLICATIONS

Korean Office Action, with English translation, issued in Korean Patent Application No. KR 10-2007-0066482, mailed Dec. 31, 2008.
Notice of Allowance issued from Korean Intellectual Property Office on May 29, 2009 with an English Translation.

* cited by examiner

*Primary Examiner*—Viet Q Nguyen
(74) *Attorney, Agent, or Firm*—IP & T Law Firm PLC

(57) ABSTRACT

A semiconductor memory device includes: an input pad set configured to receive an external input signal and a reference voltage; an input buffer set configured to detect and transmit the input signal to an internal circuit of the semiconductor memory device by comparing the input signal with the reference voltage; and a reference voltage generation circuit configured to generate the reference voltage to supply the reference voltage to the input pad set and the input buffer set during a test operation, the reference voltage generation circuit being deactivated after the semiconductor memory device is packaged.

21 Claims, 5 Drawing Sheets

SEMICONDUCTOR MEMORY DEVICE

CROSS-REFERENCE TO RELATED APPLICATIONS

This application claims priority of Korean patent application number 10-2007-0066482, filed on Jul. 3, 2007, which is incorporated by reference in its entirety.

BACKGROUND OF THE INVENTION

The present subject matter relates to a semiconductor memory device, and more particularly, an apparatus and method for testing a semiconductor memory device after finishing fabrication of the semiconductor memory device in a mass-production process.

A semiconductor memory device is used in a system as a data storage. When a data processing unit such as a central processing unit (CPU) requests data stored at a predetermined address, the semiconductor memory device provides the data to the central processing unit using address information received from the data processing unit. When the data processing unit sends data to the semiconductor memory device, the semiconductor memory device stores the data at an address specified by the data processing unit.

With the development of high-speed semiconductor systems and highly advanced semiconductor integrated circuits, semiconductor memory devices have been required to output and store data at higher speed. Furthermore, recent semiconductor memory devices are required to store more data, enable high-speed read/write operations, and consume less power. For these reasons, the design and manufacturing process for semiconductor memory devices have become more complicated, and thus the test procedures for finished semiconductor memory devices have become more complicated and difficult.

Due to the development of improved semiconductor manufacturing technology, a ratio of cost for testing a finished semiconductor memory device to cost for manufacturing process of the semiconductor memory device has been increased. In addition, semiconductor memory devices are manufactured using a much larger wafer, and more chips can be obtained from one wafer owing to the improvement in semiconductor manufacturing technology. As a result, it takes much more time to inspect finished semiconductor memory devices before packaging each chip of the semiconductor memory devices.

A plurality of chips of a wafer is simultaneously (not sequentially) inspected using a test apparatus. To this end, the test apparatus includes a probe card having a plurality of pins so that signals such as a test signal and a power signal can be simultaneously applied to a plurality of chips through the pins. The number of pins of the test apparatus cannot be increased above a predetermined level due to physical and cost-related limitations, thereby making it difficult to test semiconductor apparatuses more efficiently. However, since there is an increasing need for high-speed and high-capacity semiconductor memory devices, the number of pins of a probe card should be increased for rapidly testing each chip of a semiconductor memory device.

FIG. 1 is a block diagram explaining how a conventional semiconductor memory device is tested.

Referring to FIG. 1, a chip 200 of the semiconductor memory device includes a signal input pad set 220 and an internal circuit 240. The signal input pad set 220 includes a plurality of signal input pads 221_1 to 222_I and a reference voltage pad 224 that are connected to an external test device 100 for testing the chip 200. The internal circuit 240 includes a plurality of input buffers 242_1 to 242_I for transmitting input signals inputted through the signal input set 220 from the external test device 100.

Each of the input buffers 242_1 to 242_I detects a corresponding input signal by comparing the input signal with a reference voltage VREF received through the reference voltage pad 224. Hence, the semiconductor memory device with the chip 200 can be normally operated at a low power voltage, and the power consumption of a system including the semiconductor memory device can be reduced. Specifically, when the semiconductor memory device is operated at a low power voltage, the swing width of control signals or data signals to/from the semiconductor memory device can be lowered. In this case, it is difficult for an input/output circuit to detect a data or control signal. Therefore, the input buffers 242_1 to 242_I are designed to detect the input signals by comparing the input signals with the reference voltage VREF received through the reference voltage pad 224.

In this case, since the reference voltage VREF as well as the input signals has to be applied to each chip 200 of the semiconductor memory device for testing the semiconductor memory device, the external test device 100 should have many probe card pins for simultaneously testing a plurality of chips of the semiconductor memory device. That is, the number of probe card pins of the external test device 100 has to be increased in proportion to the number of chips that are to be simultaneously tested, thereby making it difficult to make a probe card of the external test device 100. As a result, test costs increase.

SUMMARY OF THE INVENTION

Embodiments of the present invention are directed to providing a semiconductor memory device that can be tested using a reference voltage generated by an internal reference voltage generation circuit having a fuse instead of using a reference voltage received from an external test device, so that the number of input pads of the semiconductor memory device can be reduced, and the reference voltage generation circuit can be deactivated using the fuse after packaging, thereby preventing unexpected influences.

In accordance with an aspect of the present invention, there is provided a semiconductor memory device, including: an input pad set configured to receive an external input signal and a reference voltage; an input buffer set configured to detect and transmit the input signal to an internal circuit of the semiconductor memory device by comparing the input signal with the reference voltage; and a reference voltage generation circuit configured to generate the reference voltage to supply the reference voltage to the input pad set and the input buffer set during a test operation, the reference voltage generation circuit being deactivated after the semiconductor memory device is packaged.

In accordance with an aspect of the present invention, there is provided a semiconductor memory device, including: an input/output circuit including a plurality of input pads and a plurality of input buffers, the input pads being configured to receive external input signals and a reference voltage and the input buffers being configured to detect and transmit the input signals to an internal circuit of the semiconductor memory device by comparing the input signals with the reference voltage; and a reference voltage generation circuit configured to generate the reference voltage and supply the reference voltage to the input/output circuit, wherein the reference voltage generation circuit generates the reference voltage for testing the semiconductor memory device and is deactivated after testing.

DESCRIPTION OF SPECIFIC EMBODIMENTS

Since semiconductor memory devices have to be mass-produced at a low defect rate for competition in the market, the efficiency of a test operation for finished products is very important. The present invention provides a semiconductor memory device that can be connected to an external test device through fewer probe card pins. In detail, the semiconductor memory device of the present invention includes a reference voltage generation circuit to generate a reference voltage during a test operation of the semiconductor memory device so that the semiconductor memory device can be efficiently tested without an external supply of a reference voltage. Furthermore, the reference voltage generation circuit can be deactivated after the semiconductor memory device is packaged to prevent undesired influences caused by the reference voltage generation circuit. Therefore, more semiconductor memory devices can be simultaneously tested during a final wafer test operation, and thus the production rate of the semiconductor memory devices can be increased.

Hereinafter, a semiconductor memory device for reducing test time in accordance with the present invention will be described in detail with reference to the accompanying drawings.

Figure 2:
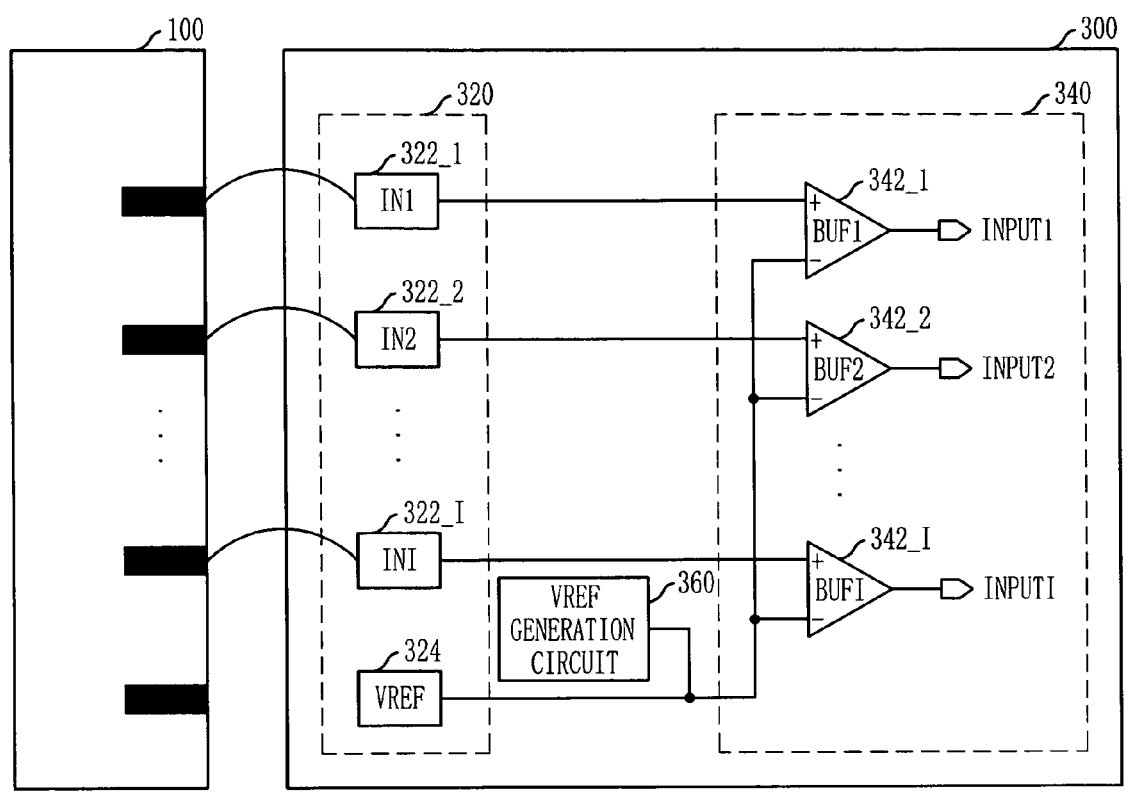
FIG. 2 is a block diagram explaining how a semiconductor memory device is tested in accordance with a first embodiment of the present.

FIG. 2 is a block diagram explaining how a semiconductor memory device is tested in accordance with a first embodiment of the present invention.

Figure 1:
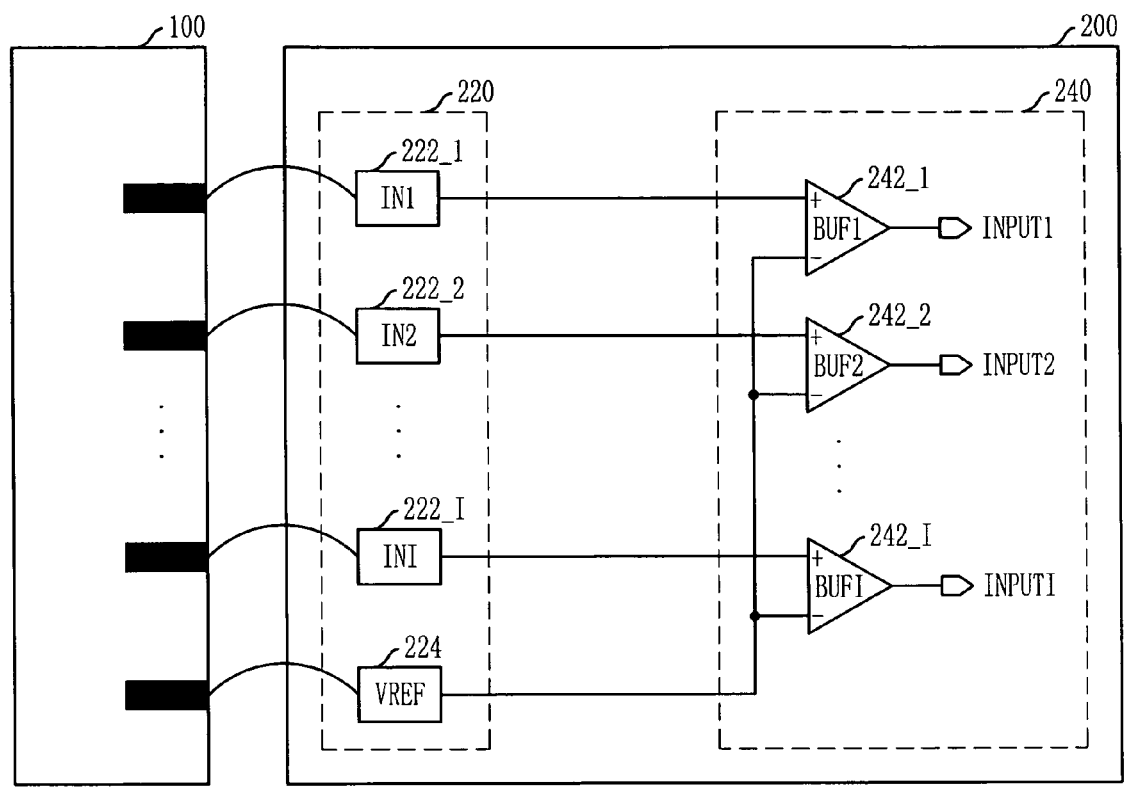
FIG. 1 is a block diagram explaining how a conventional semiconductor memory device is tested.

Referring to FIG. 2, a chip 300 of the semiconductor memory device includes an input pad set 320, an internal circuit 340, and a reference voltage generation circuit 360. The input pad set 320 includes a plurality of signal input pads 322_1 to 322_I and a reference voltage pad 324. The signal input pads 322_1 to 322_I are connected between an external test device 100 and the internal circuit 340, and the reference voltage pad 324 is connected to the reference voltage generation circuit 360. The internal circuit 340 includes an input buffer set having a plurality of input buffers 342_1 to 342_I for transmitting input signals from the input pad set 320. During testing the chip 300, the reference voltage generation circuit 360 generates a reference voltage VREF and applies the reference voltage VREF to the input pad set 320 and the input buffer set of the internal circuit 340. After packaging the chip 300, the reference voltage generation circuit 360 is deactivated. When the chip 300 is inspected using the external test device 100, although the signal input pads 322_1 to 322_I of the input pad set 320 are connected to the external test device 100, a reference voltage pad 324 of the input pad set 320 is not connected to the external test device 100 unlike the reference voltage pad 224 of the conventional chip 200 shown in FIG. 1.

The input pad set 320 includes the signal input pads 322_1 to 322_I for receiving and outputting the input signals, and the reference voltage pad 324 for receiving the reference voltage VREF. The reference voltage generation circuit 360 is connected to the reference voltage pad 324. The number of the signal input pads 322_1 to 322_I is equal to the number of the input buffers 342_1 to 342_I to transmit the input signals received from the external test device 100.

Figure 3:
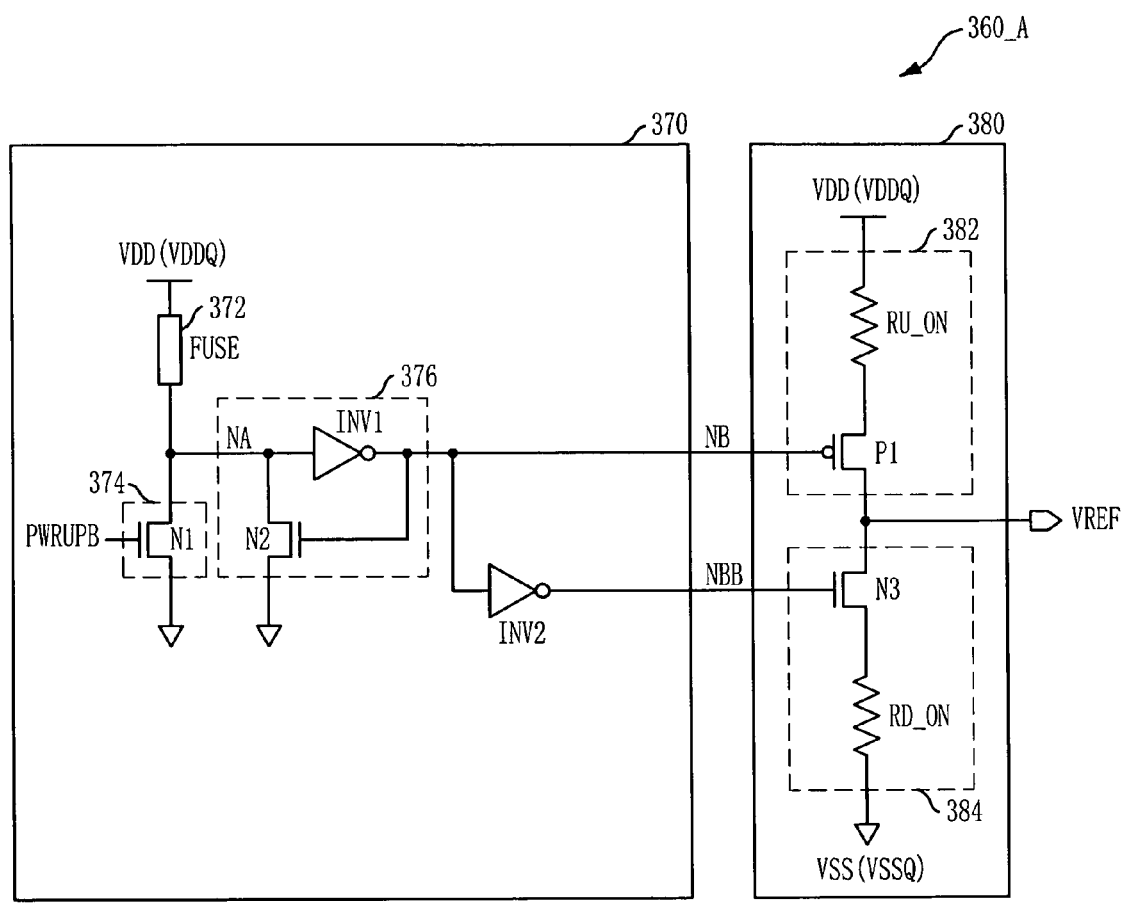
FIG. 3 is a circuit diagram illustrating a reference voltage generation circuit of the semiconductor memory device of FIG. 2 in accordance with a second embodiment of the present invention.

FIG. 3 is a circuit diagram illustrating a reference voltage generation circuit 360_A, an example of the reference voltage generation circuit 360 of FIG. 2, in accordance with a second embodiment of the present invention.

Referring to FIG. 3, the reference voltage generation circuit 360_A includes a voltage control unit 370 and a voltage generation unit 380. after a power voltage VDD is applied, the voltage control unit 370 outputs first and second control signals NB and NBB that are corresponding to an initialization signal PWRUPB. The voltage generation unit 380 generates the reference voltage VREF in response to the first and second control signals NB and NBB.

In detail, the voltage control unit 370 includes a fuse 372, an initialization portion 374, a latch 376, and a second inverter INV2. The fuse 372 connected between a power voltage (VDD) terminal and a first node NA may be broken after the chip 300 is packaged. The initialization portion 374 includes a first metal-oxide-semiconductor (MOS) transistor N1 connected between the first node NA and a ground voltage (VSS) terminal for performing an initialization operation in response to the initialization signal PWRUPB. The latch 376 generates the first control signal NB by inverting a signal at the first node NA. The second inverter INV2 generates the second control signal NBB by inverting the first control signal NB.

In detail, the latch 376 includes a first inverter INV1 for inverting the signal at the first node NA and a second MOS transistor N2 having a gate receiving an output of the first inverter INV1 and connected between the first node NA and the ground voltage (VSS) terminal.

The voltage generation unit 380 includes a pull-up generator 382 for generating the reference voltage VREF in response to the first control signal NB, and a pull-down generator 384 for generating the reference voltage VREF in response to the second control signal NBB. The pull-up generator 382 includes a first resistor RU_ON and a third MOS transistor P1. The first resistor RU_ON is connected to the power voltage (VDD) terminal, and the third MOS transistor P1 is connected to the first resistor RU_ON to generate the reference voltage VREF in response to the first control signal NB. The pull-down generator 384 includes a second resistor RD_ON and a fourth MOS transistor N3. The second resistor RD_ON is connected to the ground voltage (VSS) terminal, and the fourth MOS transistor N3 is connected to the second resistor RD_ON to generate the reference voltage VREF in response to the second control signal NBB.

Figure 4:
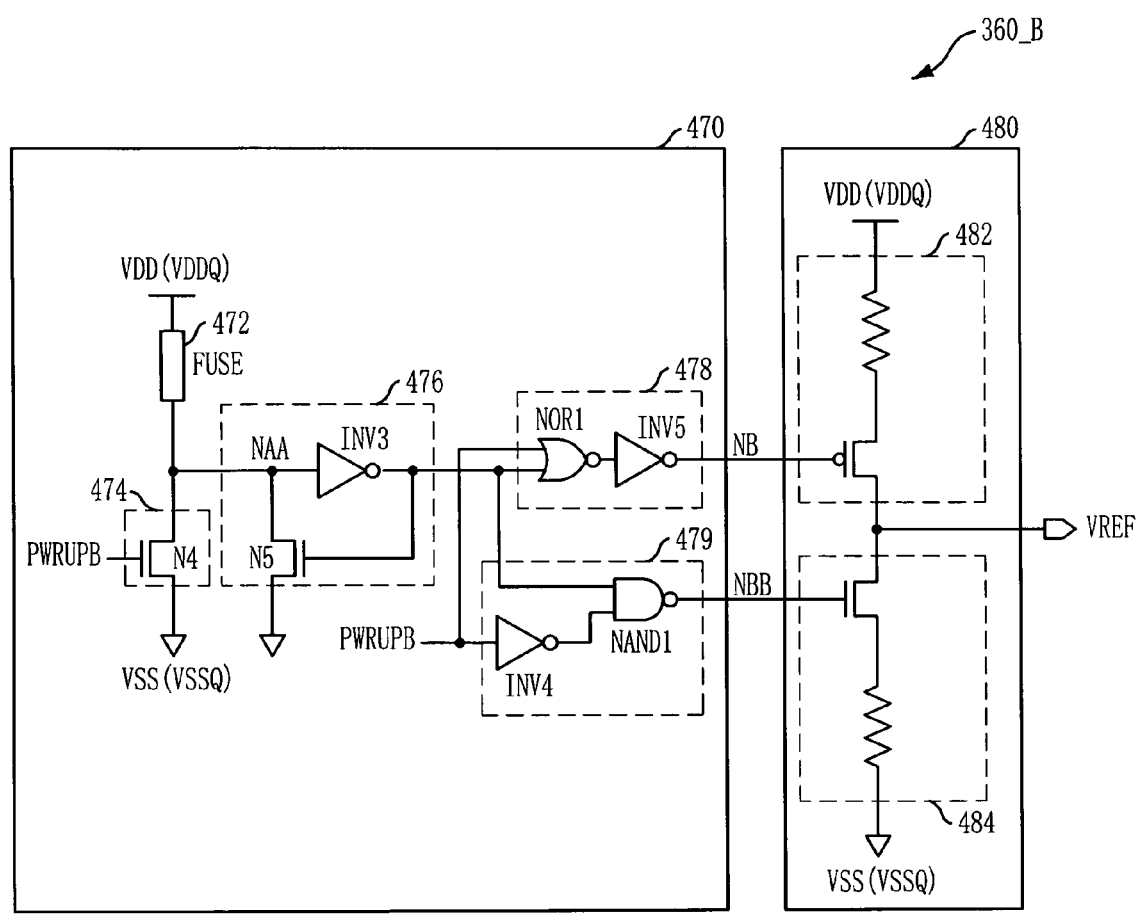
FIG. 4 is a circuit diagram illustrating a reference voltage generation circuit of the semiconductor memory device of FIG. 2 in accordance with a third embodiment of the present invention.

FIG. 4 is a circuit diagram illustrating a reference voltage generation circuit 360_B, another example of the reference voltage generation circuit 360 of FIG. 2, in accordance with a third embodiment of the present invention.

Referring to FIG. 4, like the reference voltage generation circuit 360_A of FIG. 3, the reference voltage generation circuit 360_B includes a voltage control unit 470 and a voltage generation unit 480. The voltage generation unit 480 has substantially the same structure as that of the voltage generation unit 380 of FIG. 3, and thus a detailed description of the voltage generation unit 480 will be omitted.

The voltage control unit 470 includes a fuse 472, an initialization portion 474, a latch 476, a first logic portion 478, and a second logic portion 479. The fuse 472 connected between a power voltage (VDD) terminal and a second node NAA may be broken after the chip 300 is packaged. The initialization portion 474 includes a first MOS transistor N4 connected between the second node NAA and a ground voltage (VSS) terminal for performing an initialization operation in response to an initialization signal PWRUPB. The latch 476 latches and inverts a signal at the second node NAA. The first logic portion 478 generates a first control signal NB by performing a logic operation on an output signal of the latch 476 and the initialization signal PWRUPB. The second logic portion 479 generates a second control signal NBB by performing a logic operation on the output signal of the latch 476 and the initialization signal PWRUPB.

Like the latch 376 of FIG. 3, the latch 476 includes a first inverter INV3 for inverting the signal at the second node NM and a second MOS transistor N5 having a gate receiving an output of the first inverter INV3 and connected between the second node NAA and the ground voltage (VSS) terminal.

The first logic portion 478 includes a NOR gate NOR1 for performing a NOR operation on the output signal of the latch 476 and the initialization signal PWRUPB, and a second inverter INV5 for inverting an output of the NOR gate NOR1 to output the first control signal NB. The second logic portion 479 includes a third inverter INV4 for inverting the initialization signal PWRUPB, and a NAND gate NAND1 for performing a NAND operation on the output signal of the latch 476 and an output signal of the third inverter INV4 to output the second control signal NBB.

Figure 5:
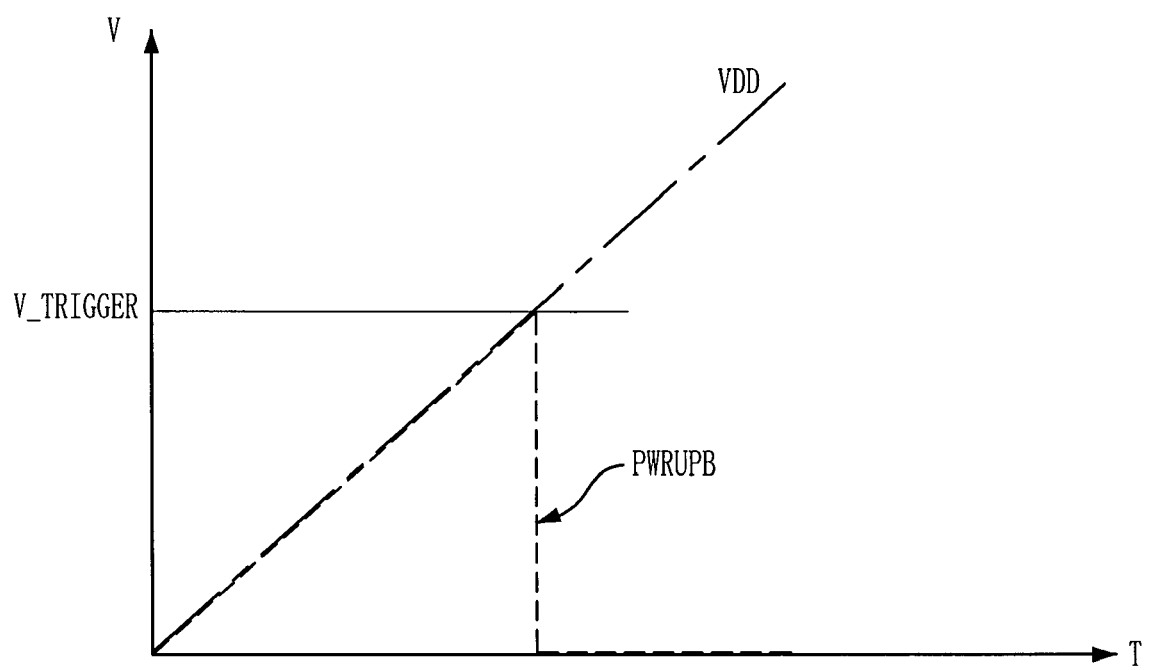
FIG. 5 is a graph explaining an operation of the reference voltage generation circuit of the semiconductor memory device of FIG. 2.

FIG. 5 is a graph explaining an operation of the reference voltage generation circuit 360 of FIG. 2.

Referring to FIG. 5, a voltage level of the initialization signal PWRUPB increases according to a voltage level of the power voltage VDD applied to the semiconductor memory device and drops to a voltage level of the ground voltage (VSS) when the power voltage VDD reaches a predetermined voltage level V_TRIGGER. While the power voltage VDD increases from the voltage level of the ground voltage (VSS) to the predetermined voltage level V_TRIGGER during a test operation, the reference voltage generation circuit 360 stays in an initialization state, and when the power voltage VDD reaches the predetermined voltage level V_TRIGGER, the reference voltage generation circuit 360 generates a reference voltage VREF.

Thereafter, when the voltage level of the initialization signal PWRUPB drops to the voltage level of the ground voltage (VSS), the power voltage VDD is applied to the latch 376 or 476 through the fuse 372 or 472 so that the voltage control unit 370 or 470 can output the first and second control signals NB and NBB to the voltage generation unit 380 or 480. Then, the voltage generation unit 380 or 480 generates the reference voltage VREF related with a resistance ratio of the first and second resistors RU_ON and RD_ON by using the first and second control signals NB and NBB. The reference voltage VREF is inputted to each of the input buffers 342_1 to 342_I as shown in FIG. 2. Therefore, during a test operation, each of the input buffers 342_1 to 342_I can detect the input signals transmitted from the external test device 100 through the input pad set 320 by comparing the input signals with the reference voltage VREF for transmitting the detected signal to an inner circuit of the chip 300. Since the reference voltage generated in the chip 300 is used instead of using a reference voltage received from an external test device, the pads of the chip 300 used for connecting the chip 300 to the external test device can be reduced in number. Therefore, more semiconductor memory devices can be simultaneously tested using an external test device without increasing the number of probe card pins of the external test device.

In the above-described embodiments of the present invention, the fuse of the voltage control unit of the reference voltage generation circuit is broken after packaging to prevent unexpected influence thereof. However, in another embodiment of the present invention, the reference voltage generation circuit can be initialized by the initialization signal and output the reference voltage having a ground voltage level regardless of the state of the fuse of the voltage control unit of the reference voltage generation circuit.

According to the present subject matter, the semiconductor memory device can be connected to an external test device through fewer input pads so that more semiconductor memory devices can be simultaneously tested using an external test device without increasing the number of probe card pins of the external test device, and thus test time can be reduced. Therefore, manufacturing costs of the semiconductor memory device can be reduced.

In detail, when the semiconductor memory device is tested, the reference voltage generation circuit of the semiconductor memory device generates a reference voltage, and the reference voltage generation circuit is deactivated when the semiconductor memory device is packaged after the test in order to prevent unexpected influences caused by the reference voltage generation circuit. Therefore, the number of probe card pins of an external test device can be reduced by one for each chip. That is, more chips can be simultaneously tested using the external test device without increasing the number of pins of a probe card of the external test device.

While the present subject matter has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   an input pad set configured to receive external input signals and a reference voltage;
   an input buffer set configured to detect and transmit the external input signals to an internal circuit of the semiconductor memory device by comparing the external input signals with the reference voltage; and
   a reference voltage generation circuit configured to generate the reference voltage to supply the reference voltage to the input pad set and the input buffer set during a test operation, the reference voltage generation circuit being deactivated after the semiconductor memory device is packaged,
   wherein the reference voltage generation circuit includes:
   a voltage control unit configured to output first and second control signals in response to an initialization signal after a power voltage is applied; and
   a voltage generation unit configured to generate the reference voltage in response to the first and second control signals.

2. The semiconductor memory device as recited in claim 1, wherein the input pad set comprises:
   a plurality of signal input pads, each of which receives and transfers a corresponding one of the external input signals to the input buffer set; and
   a reference voltage pad configured to receive the reference voltage.

3. The semiconductor memory device as recited in claim 2, wherein the reference voltage generation circuit is connected to the reference voltage pad.

4. The semiconductor memory device as recited in claim 1, wherein the voltage control unit comprises:
 a fuse configured be disconnected after the semiconductor memory device is packaged;
 an initialization portion configured to perform an initialization operation according to the initialization signal;
 a latch configured to generate the first control signal by inverting a signal at a common node of the fuse and the initialization portion; and
 a first inverter configured to generate the second control signal by inverting the first control signal.

5. The semiconductor memory device as recited in claim 4, wherein the latch comprises:
 a second inverter configured to invert the signal at the common node; and
 a metal-oxide-semiconductor (MOS) transistor coupled to the common node and including a gate receiving an output of the second inverter.

6. The semiconductor memory device as recited in claim 1, wherein the voltage control unit comprises:
 a fuse configured to be disconnected after the semiconductor memory device is packaged;
 an initialization portion configured to perform an initialization operation according to the initialization signal;
 a latch configured to invert a signal at a common node of the fuse and the initialization portion;
 a first logic portion configured to generate the first control signal by performing a first logic operation on an output signal of the latch in response to the initialization signal; and
 a second logic portion configured to generate the second control signal by performing a second logic operation on the output signal of the latch in response to the initialization signal.

7. The semiconductor memory device as recited in claim 6, wherein the first logic portion includes:
 a first logic gate for performing a NOR operation on the output signal of the latch and the initialization signal; and
 a second logic gate for inverting an output of the first logic gate to output the first control signal.

8. The semiconductor memory device as recited in claim 6, wherein the first logic portion includes:
 a first logic gate for inverting the initialization signal; and
 a second logic gate for performing a NAND operation on the output signal of the latch and an output signal of the first logic gate to output the second control signal.

9. The semiconductor memory device as recited in claim 1, wherein a voltage level of the initialization signal increases according to a voltage level of the power voltage applied to the semiconductor memory device, and drops to a voltage level of a ground voltage when the voltage level of the power voltage reaches a predetermined voltage level.

10. The semiconductor memory device as recited in claim 1, wherein the voltage generation unit comprises:
 a pull-up generator configured to generate the reference voltage in response to the first control signal; and
 a pull-down generator configured to generate the reference voltage in response to the second control signal.

11. The semiconductor memory device as recited in claim 10, wherein the pull-up generator comprises:
 a pull-up resistor configured to receive the power voltage; and
 a MOS transistor configured to be coupled to the pull-up resistor for generating the reference voltage in response to the first control signal.

12. The semiconductor memory device as recited in claim 10, wherein the pull-down generator comprises:
 a pull-down resistor configured to receive a ground voltage; and
 a MOS transistor configured to be coupled to the pull-down resistor for generating the reference voltage in response to the second control signal.

13. The semiconductor memory device as recited in claim 1, wherein the voltage control unit generates the reference voltage of a voltage level of a ground voltage level, the voltage control unit being initialized by the initialization signal regardless of a state of a fuse included in the voltage control unit.

14. A semiconductor memory device, comprising:
 an input/output circuit including a plurality of input pads and a plurality of input buffers, the input pads being configured to receive external input signals and a reference voltage and the input buffers being configured to detect and transmit the external input signals to an internal circuit of the semiconductor memory device by comparing the external input signals with the reference voltage; and
 a reference voltage generation circuit configured to generate the reference voltage for testing the semiconductor memory device, supply the reference voltage to the input/output circuit, and be deactivated after testing the semiconductor memory device,
 wherein the reference voltage generation circuit includes:
 a voltage control unit configured to output first and second control signals in response to an initialization signal after a power voltage is inputted to the voltage control unit; and
 a voltage generation unit configured to generate the reference voltage in response to the first and second control signals.

15. The semiconductor memory device as recited in claim 14, wherein the input pads of the input/output circuit comprises:
 a plurality of signal input pads each of which receives and transfers a corresponding one of the external input signals to a corresponding one of the input buffers; and
 a reference voltage pad configured to receive the reference voltage.

16. The semiconductor memory device as recited in claim 15, wherein the reference voltage generation circuit is connected to the reference voltage pad.

17. The semiconductor memory device as recited in claim 14, wherein the voltage control unit comprises:
 a fuse configured to be disconnected after the semiconductor memory device is packaged;
 an initialization portion configured to perform an initialization operation according to the initialization signal;
 a latch configured to generate the first control signal by inverting a signal at a common node of the fuse and the initialization portion; and
 an inverter configured to generate the second control signal by inverting the first control signal.

18. The semiconductor memory device as recited in claim 14, wherein the voltage control unit comprises:
 a fuse configured to be disconnected after the semiconductor memory device is packaged;
 an initialization portion configured to perform an initialization operation according to the initialization signal;

a latch configured to invert a signal at a common node of the fuse and the initialization portion;

a first logic portion configured to perform an OR operation on an output signal of the latch and the initialization signal to generate the first control signal; and a second logic portion configured to perform a NAND operation on the output signal of the latch and an inversion signal of the initialization signal to generate the second control signal.

19. The semiconductor memory device as recited in claim 14, wherein a voltage level of the initialization signal increases according to a voltage level of the power voltage applied to the semiconductor memory device, and drops to a voltage level of a ground voltage level when the voltage level of the power voltage reaches a predetermined voltage level.

20. The semiconductor memory device as recited in claim 14, wherein the voltage generation unit comprises:

a pull-up generator configured to generate the reference voltage in response to the first control signal; and a pull-down generator configured to generate the reference voltage in response to the second control signal.

21. The semiconductor memory device as recited in claim 14, wherein the voltage control unit generates the reference voltage of a voltage level of a ground voltage, the voltage control unit being initialized by the initialization signal regardless of a state of a fuse included in the voltage control unit.

* * * * *